United States Patent [19]

Kraus

[11] Patent Number: 4,950,568

[45] Date of Patent: Aug. 21, 1990

[54] RADIATION MASK FOR THE LITHOGRAPHIC PRODUCTION OF PATTERNS

[75] Inventor: Heinz Kraus, Traunreut, Fed. Rep. of Germany

[73] Assignee: Johannes Heidenhain GmbH, Traunreut, Fed. Rep. of Germany

[21] Appl. No.: 155,070

[22] Filed: Feb. 8, 1988

[30] Foreign Application Priority Data

Feb. 6, 1987 [DE] Fed. Rep. of Germany ....... 3703582

[51] Int. Cl.$^5$ ................................................ G03F 1/00
[52] U.S. Cl. ......................................... 430/5; 378/35; 250/505.1
[58] Field of Search .................... 430/5, 321, 967, 22; 378/35; 250/530.1, 505.1

[56] References Cited

FOREIGN PATENT DOCUMENTS 32463 2/1987 Japan ........................................ 430/5

Primary Examiner—Jose Dees
Attorney, Agent, or Firm—Toren, McGeady & Associates

[57] ABSTRACT

A radiation mask for the lithographic production of patterns, particularly for the X-ray lithographic or ionic lithographic production of semiconductor modules and semiconductor components and of optical grids. The radiation mask includes a carrier layer mounted in a support frame. The carrier layer has a structure corresponding to the pattern to be created. The carrier layer has in its border portion between the structure and the support frame an elastic portion. This elastic portion serves to ensure dimensional accuracy of the structure when stresses occur. The elastic portion may be formed by perforations defined in the carrier layer circumferentially surrounding the structure.

6 Claims, 1 Drawing Sheet

RADIATION MASK FOR THE LITHOGRAPHIC PRODUCTION OF PATTERNS

BACKGROUND OF THE INVENTION

1. Field of the Invention

The present invention relates to a radiation mask for the lithographic production of patterns. The radiation mask includes a carrier layer mounted in a support frame. The carrier layer defines a structure corresponding to the pattern to be created.

2. Description of the Prior Art

A radiation mask of the above-described type is used particularly for the X-ray lithographic or ionic lithographic production of semiconductor modules and semiconductor components and of optical grids.

Radiation masks for the X-ray lithographic production of patterns are known from German Offenlegungsschrift No. 32 32 499 and German Offenlegungsschrift No. 34 27 449. These masks include a radiation permeable carrier layer mounted in a support frame. The carrier layer has a radiation absorbing structure which corresponds to the pattern to be created.

A radiation mask of the same type for X-ray lithography or ionic lithography is described in German Offenlegungsschrift No. 31 50 056. The support frame for the radiation permeable carrier layer of the mask has markings for the optical alignment of the radiation mask relative to the semiconductor substrate to be irradiated.

Since a high resolution of the pattern to be created can be achieved particularly by means of X-ray lithography, an extremely high dimensional accuracy of the structure of the radiation mask corresponding to the pattern to be created is absolutely required.

In the manufacture and the use of such a radiation mask, variable stress components occur for various reasons, for example, due to temperature-related loading of the carrier layer with the structure during irradiation or due to deformations of the carrier layer with the structure caused by improper fastening in the support frame. These variable stress components may lead to non-reproducible lateral distortions of the carrier layer, so that the dimensional accuracy of the radiation mask is no longer ensured.

German Offenlegungsschrift No. 34 25 063 discloses a radiation mask for X-ray lithography in which such lateral mechanical distortions are avoided by means of a stress-compensated carrier layer. This carrier layer is a silicon layer doped with two different materials to achieve the stress compensation. However, this type of stress compensation requires specific materials. In addition, a radiation mask with this type of stress compensation is difficult to manufacture.

It is, therefore, the primary object of the present invention to provide a radiation mask of the above-described type in which the dimensional accuracy of the structure is maintained during the occurrence of stress components.

SUMMARY OF THE INVENTION

In accordance with the present invention, the carrier layer of the radiation mask has an elastic portion in the border region thereof between the structure and the support frame.

The particular advantage of the radiation mask according to the present invention resides in that the elastic portion in the border region of the carrier layer between the structure and the support frame leads in a simple manner to a compensation of occurring stress components.

The elastic portion of the carrier layer may be formed by at least two rows of perforations which surround the portion with the structure. These perforations can be easily manufactured. In addition, there are no constraints with respect to the materials suitable as carrier layers.

The various features of novelty which characterize the invention are pointed out with particularity in the claims annexed to and forming a part of this disclosure. For a better understanding of the invention, its operating advantages and specific objects attained by its use, reference should be had to the drawings and descriptive matter in which there is illustrated and described a preferred embodiment of the invention.

DETAILED DESCRIPTION OF THE INVENTION

Figure 1:
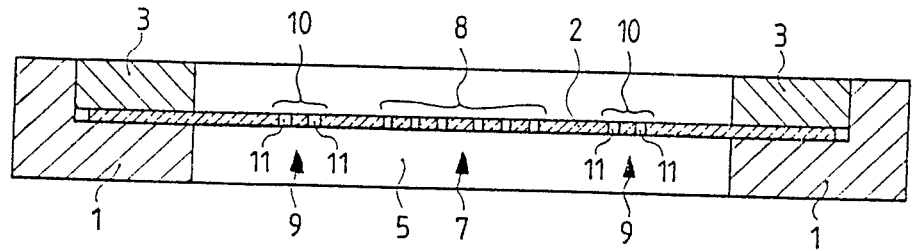
FIG. 1 is a sectional view of the radiation mask according to the present invention.
Figure 2:
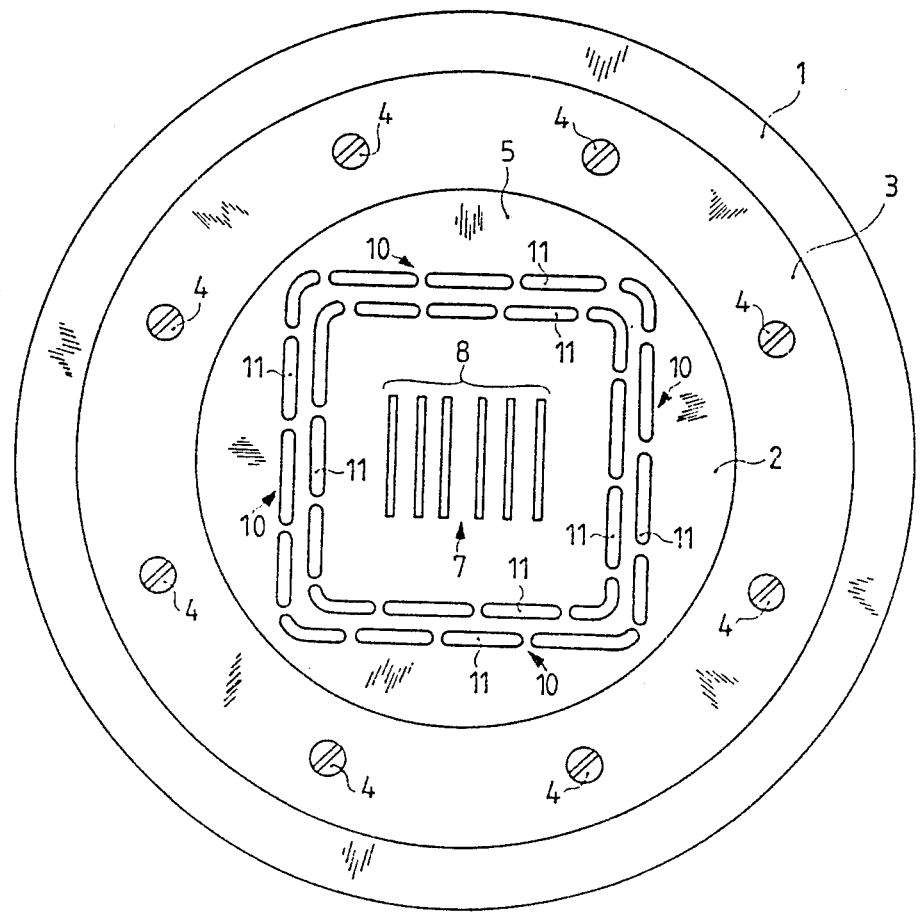
FIG. 2 is a plan view of the radiation mask of FIG. 1.

FIG. 1 of the drawing is a cross-sectional view and FIG. 2 of the drawing is a top view of the radiation mask according to the present invention. The radiation mask is used for lithographically producing patterns having high resolutions, particularly of optical grids and of semiconductor modules and semiconductor components by means of X-ray lithography or ionic lithography.

A circular ring-shaped support frame 1, for example, of invar, supports a radiation absorbing carrier layer 2, for example, of nickel. Carrier layer 2 is fastened in support frame 1 by means of a clamping ring 3 and screws 4. Carrier layer 2 is fastened in support frame 1 with a certain initial tension to prevent sagging of the carrier layer 2 and to ensure planeness of the carrier layer 2 in the inner portion 5 of support frame 1.

In the inner portion 5 of support frame 1, carrier layer 2 has a structure portion 7 with a radiation permeable structure 8 obtained by photolithographic means.

When the carrier layer 2 is fastened in the support frame 1 by means of clamping ring 3, stress components may occur in the carrier layer 2 which may lead to non-reproducible lateral distortions in the carrier layer 2, so that the dimensional accuracy of structure 8 in structure portion 7 of the carrier layer 2 of the radiation mask is no longer ensured. Such variable stress components may also occur during the use of the radiation mask due to temperature-related loading of the carrier layer 2 during the irradiation.

For the compensation of such stress components, it is proposed in accordance with the present invention to provide the border portion 9 of carrier layer 2 with an elastic portion 10 between the structure portion 7 including structure 8 and the support frame 1. This elastic portion 10 is formed by perforations 11 defined in carrier layer 2. These perforations 11 surround the structure portion 7 including structure 8 in at least two rows.

In the preferred embodiment of the present invention illustrated in FIGS. 1 and 2, perforations 11 surround structure portions 7 including structure 8 in two rows in which the perforations of the two rows are circumferentially offset relative to each other. The perforations 11 are oblong in circumferential direction. As a result of this configuration, the perforations 11 form spring elements which isolate the structure portion 7 including structure 8 from the stress components which emanate from support frame 1 and clamping ring 3.

The radiation mask may also include a radiation permeable carrier layer, not shown, mounted on the radiation absorbing structure. A radiation mask of this type is described, for example, in German Offenlegungsschrift No. 34 27 449.

While a specific embodiment of the invention has been shown and described in detail to illustrate the application of the inventive principles, it will be understood that the invention may be embodied otherwise without departing from such principles.

I claim:

1. In a radiation mask for the lithographic production of patterns, including a carrier layer mounted in a support frame, the carrier layer having a structure corresponding to the pattern to be created, the improvement comprising an elastic portion defined in the carrier layer in the border portion thereof between the structure and the support frame whereby the dimensional accuracy of the structure is maintained during the occurrence of stress components.

2. The radiation mask according to claim 1, wherein the elastic portion includes perforations defined in the carrier layer.

3. The radiation mask according to claim 2, wherein the perforations are provided in at least two circumferentially extending rows.

4. The radiation mask according to claim 3, wherein the perforations of the at least two rows of perforations are circumferentially offset relative to each other.

5. The radiation mask according to claim 1, wherein the carrier layer is of a radiation absorbing material and the structure is of a radiation permeable material.

6. The radiation mask according to claim 1, wherein the carrier layer is of a radiation permeable material and the structure is of a radiation absorbing material.

* * * * *